(12) United States Patent
Bresolin et al.

(10) Patent No.: US 7,060,995 B2
(45) Date of Patent: Jun. 13, 2006

(54) ION-IMPLANTATION MACHINE, CONTROL METHOD THEREOF, AND PROCESS FOR MANUFACTURING INTEGRATED DEVICES

(75) Inventors: Camillo Bresolin, Vimercate (IT); Valter Soncini, Milan (IT); Andrea Riva, Concorezzo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 100 days.

(21) Appl. No.: 10/657,801

(22) Filed: Sep. 8, 2003

(65) Prior Publication Data

US 2004/0121498 A1    Jun. 24, 2004

(30) Foreign Application Priority Data

Sep. 10, 2002 (IT) .................. TO2002A0787

(51) Int. Cl.
*H01J 37/00* (2006.01)

(52) U.S. Cl. ............... 250/492.21; 250/492.3

(58) Field of Classification Search .......... 250/492.21, 250/492.3
See application file for complete search history.

(56) References Cited

U.S. PATENT DOCUMENTS 5,466,942 A * 11/1995 Sakai et al. ............. 250/492.2
6,093,625 A *  7/2000 Wagner et al. ............. 438/514

* cited by examiner

*Primary Examiner*—David A. Vanore
(74) *Attorney, Agent, or Firm*—Lisa K. Jorgenson; Robert Iannucci; Seed IP Law Group PLLC

(57) ABSTRACT

An ion-implantation machine has an implantation chamber with a vent inlet; a vacuum pump is connected to the implantation chamber through a vacuum valve. A pipe connects the vent inlet of the implantation chamber to a source of a fluid containing oxygen. The fluid containing oxygen is preferably environmental air. A flow-rate control valve is arranged on the pipe and is activated only after closing the vacuum valve.

12 Claims, 2 Drawing Sheets

ION-IMPLANTATION MACHINE, CONTROL METHOD THEREOF, AND PROCESS FOR MANUFACTURING INTEGRATED DEVICES

BACKGROUND OF THE INVENTION

1. Field of the Invention

The present invention relates to an improved ion-implantation machine, the control method thereof and a process for manufacturing electronic devices.

2. Description of the Related Art

As is known, ion-implantation machines (or ion implanters) are used extensively, for example, in the semiconductor industry for implanting doping ionic species in semiconductor wafers (typically silicon wafers), with the aim of modifying the electrical characteristics of selected parts of the wafers.

Commercially available implanters comprise an implantation chamber or final station where implantation is performed in high-vacuum conditions. The implantation chamber is connected to a load lock chamber, where the wafers to be implanted are brought from an atmospheric pressure to an intermediate vacuum condition thanks to a separate pumping system, before being transferred into the final chamber. For better comprehension, FIG. 1 illustrates a known implanter 1, which includes an implantation chamber 2, a load lock chamber 3 and an intermediate valve 7 arranged therebetween.

A cryogenic pump 4 is connected, through a protective cryogenic valve, or cryovalve 5, controlled by a pneumatic-control assembly 6, to the implantation chamber 2, for creating the required high-vacuum conditions. In addition, a beamline turbopump 10 is connected to the implantation chamber 2. A pump system 9 is connected, through an isolating valve 8, to the load lock chamber 3. The implantation chamber 2 is kept in vacuum conditions both by the cryogenic pump 4, the one closest to the area where the wafers are implanted, and by another beamline turbopump provided for serving other areas, which, however, are not separate from the implantation chamber 2. As a whole, the pumping system enables, among other things, a low-pressure condition to be maintained also during species crossover, which is an intermediate step between the implantation of two different ionic species, when the implanter is kept in standby and some crossover operations are carried out, for example focusing of the ion beam on a different species to be implanted.

In addition, the implantation chamber 2 has a vent port 11, through which, during the maintenance of the implantation chamber 2, an inert gas, such as nitrogen, coming from a source 16, may be introduced into the implantation chamber 2 to enable access to the chamber for maintenance purposes, bringing it from the vacuum condition up to atmospheric pressure. An electronic control module 12 controls the pneumatic control assembly 6. In a known commercial implanter, the electronic control module 12 comprises an inlet/outlet circuit 12a and a driving circuit 12b. The driving circuit 12b is divided into a branch for driving a protective cryovalve 12b1 and an auxiliary driving branch 12b2.

As illustrated schematically in FIG. 1, the pneumatic control assembly 6, which has the task of converting the electrical signals supplied by the electronic control module 12 into pneumatic controls, comprises a first circuit 14, which is connected to the protective cryovalve driving branch 12b1 and controls the protective cryovalve 5, and a second circuit 15 connected to the auxiliary driving branch 12b2, for control of auxiliary valves, which are available for particular functions required by the user.

In implanters of this type, which are used for doping with boron and other heavier elements (e.g., arsenic), it is noted that the quality of the structures made subsequently with EPM boron implants (or threshold correction EPM) may degrade considerably. In particular, in the manufacture of flash cells including a threshold modification implant (so-called EPM implant) with boron, followed by the growth of tunnel oxide, a non-negligible degradation in the electrical characteristics of the tunnel oxide has been noted, should the EPM boron implant be carried out using implanters that also utilize arsenic among the implanted species.

On the other hand, the use of dedicated implanters for each of the different ionic species is more complex, longer and costlier so as to cause a non-indifferent increase in the cost of the final electronic devices obtained.

BRIEF SUMMARY OF THE INVENTION

An embodiment of the present invention solves the problem of degradation described above.

The invention stems from the discovery that a correlation exists between the condition (cleanliness degree) of the implantation chamber and the quality of the final electrical devices made on the wafers (and in particular their tunnel oxides made on the areas that undergo the EPM boron implant) in implanters that utilize alternatively boron and other species, comprising arsenic. This correlation is explained, assuming that implantation of heavy ionic species (e.g., arsenic) causes a persistent contamination of the implantation chamber and the members present therein.

Although the physical mechanisms are not yet well explained, since this degradation experimentally vanishes following upon maintenance of the implantation chamber, which include exposure to air, the degradation has been attributed to the fact that the use of arsenic (or other heavy ions, such as antimony and indium) causes a slight sputtering from the graphite electrodes and from the other surfaces coated with carbon (for example, dirty surfaces coated with resist residue resulting from previous processes). The contaminating carbon thus dispersed remains active and mobile for a long period of time (more than 2500 implants are needed before the effects are seen to vanish) and may be transported and deposited by the ion beam (for example, boron beam) on the surface of the wafer during EPM implantation, which exposes the areas where the tunnel oxide will subsequently be formed. The contaminating carbon cannot easily be removed by the washing operations adopted for cleaning purposes, which precede tunnel oxidation, and has an adverse effect on the reliability of the oxide.

According to one embodiment of the invention, this contamination is eliminated by supplying a small amount of oxygen, preferably in the form of air, to the implantation chamber for a sufficient time to remove the contamination. In this way, it is believed that the oxygen present in the air will cause a combustion or other form of interaction with the atoms or particles of carbon so as to eliminate their effects during the subsequent uses of the equipment, for example, during the boron implant for EPM threshold modification, which precedes, during the manufacture of the devices, growing the tunnel oxide.

Previously, instead, this cleaning effect was not attained by the oxygen coming from the intermediate chamber during transfer of the wafers also because, normally, the load lock chamber is brought to quite a high vacuum before allowing connection to the implantation chamber and transferring the wafers to be implanted in order to maximize the processing speed during production. In this way, the introduction of oxygen or air into the implantation chamber from the intermediate chamber is minimal and in any case insufficient for eliminating or de-activating the carbon particles.

According to one embodiment of the invention, the implantation machine and its management are modified so as to provide a system for introducing air into the implantation chamber. In order to prevent excessive stresses on the cryogenic pump that creates the vacuum condition during implantation, with consequent increase in the regeneration frequency of the pump, the air is introduced after breaking off the connection between the implantation chamber and the cryogenic pump, preferably during species crossover so as not to affect at all the times involved in the processes and the quality thereof.

BRIEF DESCRIPTION OF THE SEVERAL VIEWS OF THE DRAWINGS

For a better understanding of the invention, an embodiment thereof is now described, purely by way of non-limiting example, with reference to the attached drawings, wherein.

DETAILED DESCRIPTION OF THE INVENTION

Figure 1:
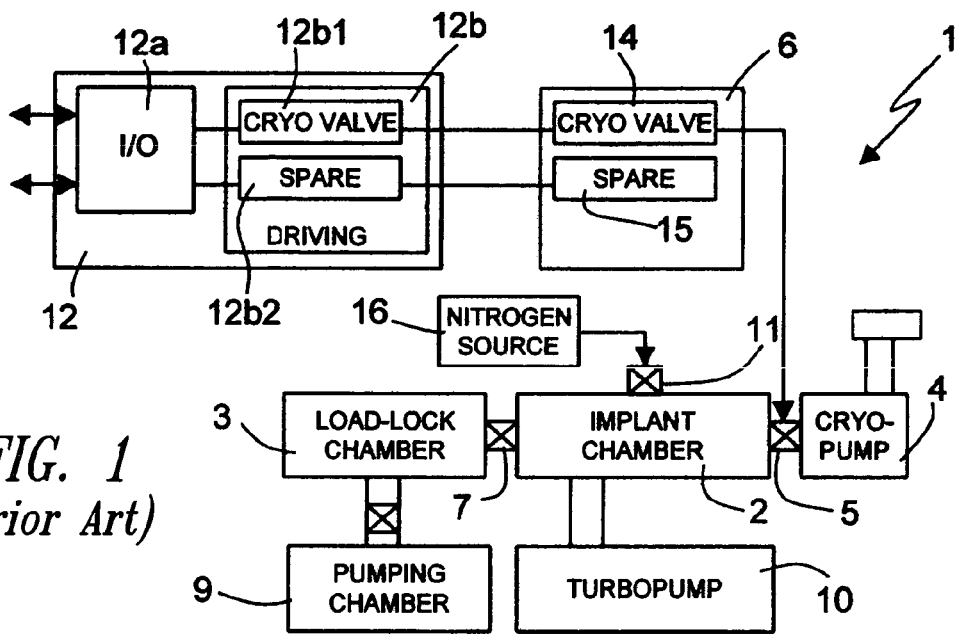
FIG. 1 illustrates a block diagram of a known ion-implantation machine.
Figure 2:
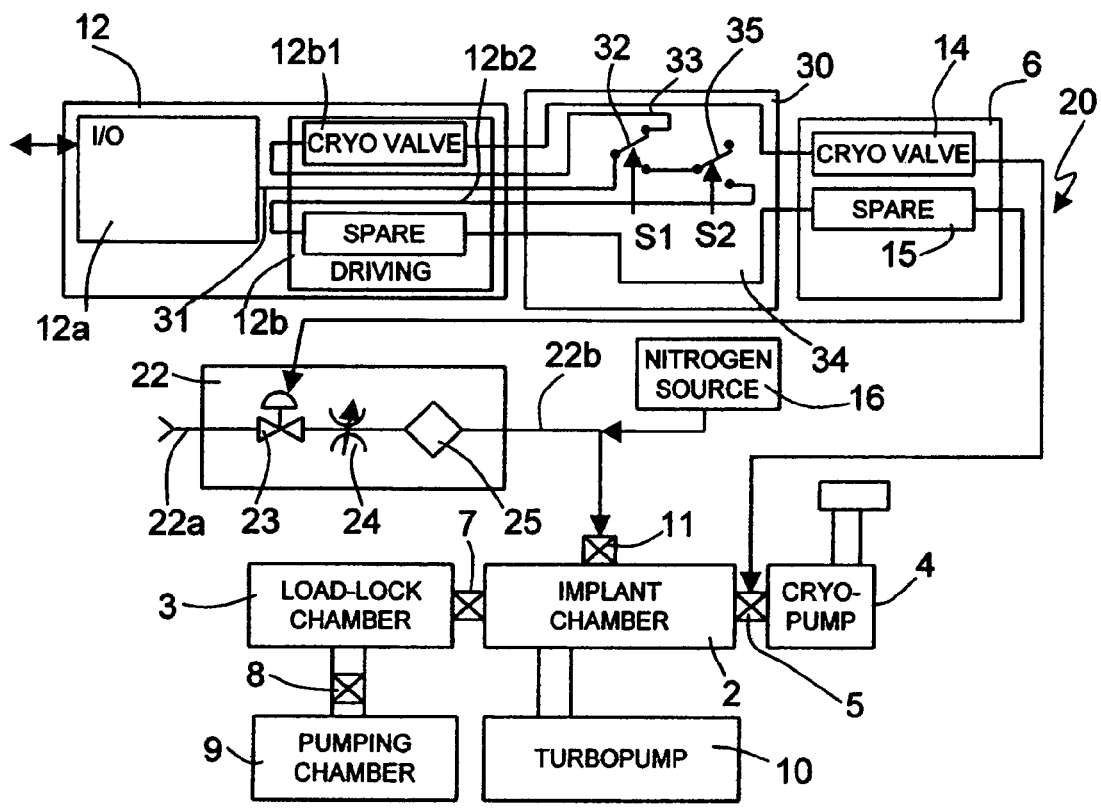
FIG. 2 illustrates a block diagram of an improved ion-implantation machine according to the invention.

FIG. 2 illustrates an embodiment of an implantation machine 20 according to the invention. In FIG. 2, the parts that are in common with the known implantation machine 1 illustrated in FIG. 1 are designated by the same reference numbers.

The implantation machine 20 comprises a vent pipe 22, which has a inlet 22a, connected to the external environment, and an outlet 22b, connected to the vent port 11. Provided on the vent pipe 22 are a vent valve or leak valve 23, of a pneumatic type, controlled by the second circuit 15 of the pneumatic control assembly 6, a metering valve 24, which enables calibration of the air flow to obtain the desired vacuum during the treatment described, and a particle filter 25.

A vent valve control module 30 is arranged between the electronic control module 12 and the pneumatic control assembly 6. The vent valve control module 30 forms in practice a crossover system, which activates alternately the first circuit 14 or the second circuit 15 and ensures activation of the vent valve 23 only when the protective cryovalve 5 is off.

In the embodiment illustrated, the vent valve control module 30 comprises a first line 31 coming out of the inlet/outlet circuit 12a and connected to an input of a change-over switch 32 which is controlled by a protective cryovalve de-activation signal s1. The change-over switch 32 has two outputs connected to a second line 33 and a third line 34, which lead to the protective cryovalve driving branch 12b1 and to the auxiliary driving branch 12b2 of the driving circuit 12b, respectively. Moreover, a switch 35 is present on the third line 34 and is controlled by a vent activation signal s2.

In use, for example in the manufacture of flash memories, after implanting a heavy ionic species, for instance arsenic, crossover is activated. In this step, the protective cryovalve 5 is closed, the implanted wafers are brought into the load lock chamber 3, the various operations needed for species crossover are activated in a known way, and the supply of environmental air is controlled through the vent valve 11 in the direction of the implantation chamber 2. In particular, the signal s1 causes disconnection of the first circuit 14 of pneumatic control of the protective cryovalve 5, and the signal s2 causes connection of the second circuit 15 of pneumatic control of the vent valve 23. Activation of air supply, controlled by signal s2, may be manual or controlled automatically through the signal for argon supply switching, which is usually activated during species crossover.

At the same time, upon supplying cleaning air, in a per se known manner, the beamline pumps 10 are active. The air flow through the vent pipe 22 is controlled taking into account the pumping of the beamline pumps 10, so as preferably to maintain, inside the implantation chamber 2, a pressure of between $1.10^{-5}$ and $5.10^{-5}$ torr (by way of reference, the basic vacuum in the absence of ion beam is around $10^{-7}$ torr). The air supply is maintained preferably for 1–5 min, and hence only for a part of the time necessary for species crossover, which typically requires approximately 10 to 15 min.

The invention has been tested in the manufacture of flash memories, for EPM boron implantation, which precedes growth of the tunnel oxide, using clean and contaminated implantation chambers and implantation chambers treated with the process described according to the invention.

Figure 3:
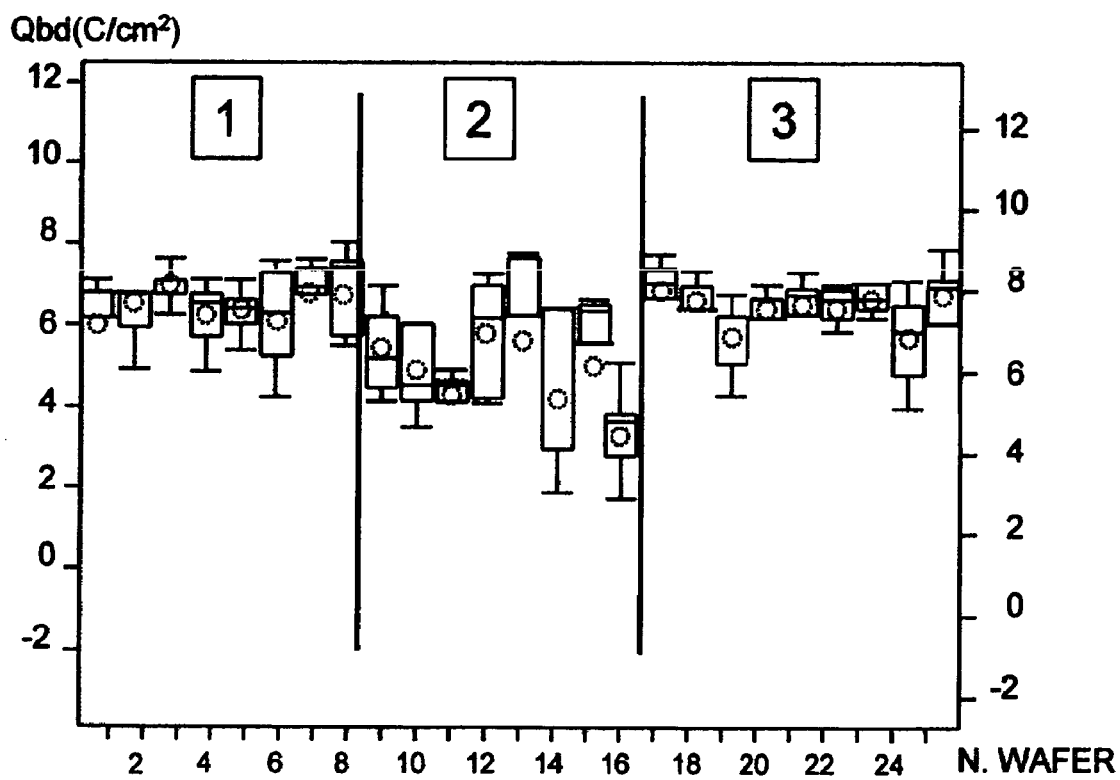
FIGS. 3 and 4 illustrate graphs obtained from tests conducted by the present applicant.
Figure 4:
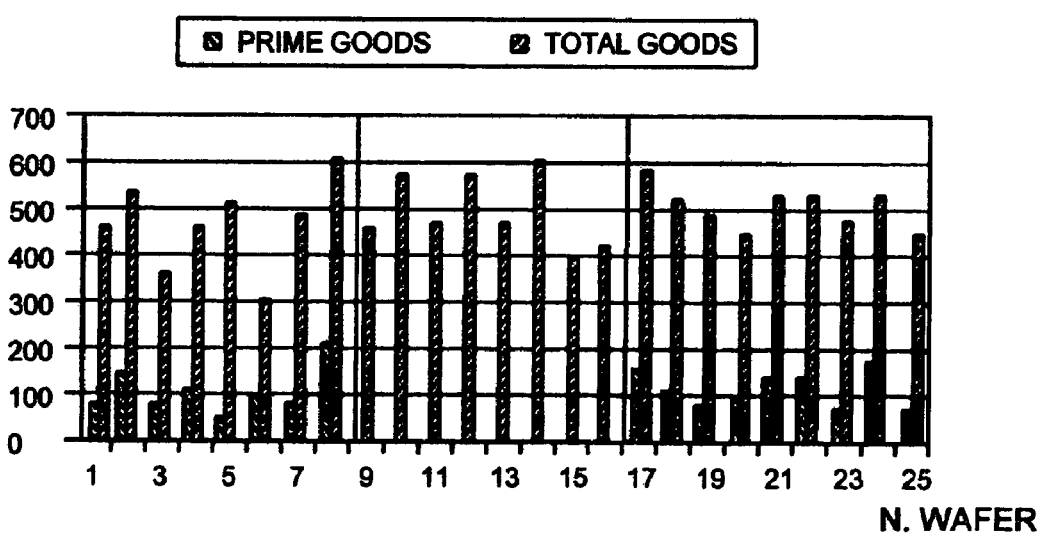

In the tests, it has been demonstrated that the supply of air during crossover has enabled a good quality of the tunnel oxide grown after boron implantation, as illustrated by the graphs shown in FIGS. 3 and 4.

In particular, FIG. 3 illustrates the value of Qbd (i.e., injected charge causing breakdown of the oxide layer of capacitor structures) of tunnel oxides made on EPM boron implanted areas. Represented in the left-hand part of FIG. 3 are the results of the measurements carried out on wafers treated in a clean implantation chamber (i.e., a chamber that had undergone maintenance, which comprised exposure to the atmosphere and in which arsenic had not yet used as species to be implanted). Represented in the central part of FIG. 3 are the results of the measurements made on wafers treated in an implantation chamber that had previously been contaminated with some arsenic implants (dose>$10^{14}$ at/cm$^2$) according to the traditional scheme (contaminated chamber). Shown in the right-hand part of FIG. 3 are the results of the measurements made on wafers treated in the same implantation chamber (and subjected to arsenic implantation) after prior treatment of the chamber with controlled introduction of air performed just once for 5 min (clean chamber).

As visible, by virtue of the invention, values comparable with the ones obtainable in the case of implantation using a clean chamber are obtained, taking into account that high Qbd values and low dispersions are indices of high quality of an oxide.

FIG. 4 illustrates final EWS test data (i.e., electrical wafer sorting test data) in case of a boron implant performed in the same implantation machine, as regards the prime yield, for a 16-Mbit flash memory. Also in this case, the data on the left regard a treatment in the absence of contamination from arsenic, the central data regard the case of contamination as a result of the arsenic implant, and the data on the right regard treatment with arsenic and boron and aeration according to the invention.

The implantation machine described and its control method have the following advantages.

First, it is possible to decontaminate the implantation chamber at low costs, ensuring a manufacture quality similar to that of a clean implant (i.e., in the absence of contaminating implantation or with complete maintenance of the implantation chamber after the contamination implant).

As compared to a solution including exposure of the implantation chamber to air, the recovery time for restoring the operating conditions is considerably lower (a few minutes as against approximately 6 h).

The implantation machine requires minor modifications, consequently the additional costs are negligible as compared to a traditional machine, and the manufacture costs are comparable to the traditional ones, albeit with a considerable improvement in the manufacture quality and flexibility of use of the implants.

Activation of the air supply only when the protective cryovalve is closed (guaranteed by the vent valve control module 30) ensures that the cryogenic pump 4 will not be exposed directly to the air flow, which would cause rapid drop in the pumping performance and need for earlier regeneration as compared to the normal use conditions.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

Finally, it is evident that modifications and variations can be made to the solution described herein, without thereby departing from the scope of the present invention.

For example, the same solution is applicable also to processes comprising implantation of different heavy ionic species, such as antimony and indium. For example, the invention is applicable advantageously in the case of using ionic species with an atomic weight greater than 12, in the same equipment in addition to boron and, since such ionic species are potentially able to generate surface erosion (by sputtering) of carbon-rich materials (atomic mass 12), triggering the above discussed mechanism of contamination. The decontamination step may be performed, instead of during crossover, also for each individual lot or else in a continuous way, even though the described solution is preferred so as to ensure reproducibility of the implantation doses or the time needed for achieving the minimum vacuum conditions required for starting the implant (start implant set point).

The invention claimed is:

1. An ion-implantation machine, comprising:
   an implantation chamber having a vent inlet;
   a vacuum pump connected to said implantation chamber;
   means for connecting said vent inlet to a source of a fluid containing oxygen, wherein said fluid containing oxygen is environmental air, and wherein said means for connecting comprise a pipe having an open inlet, an outlet connected to said vent inlet, and flow-rate control means; and
   a protection valve arranged between said vacuum pump and said implantation chamber, and a control unit, controlling said protection valve, wherein said flow-rate control means comprise a vent valve controlled by said control unit.

2. The ion-implantation machine according to claim 1 wherein said pipe further comprises a flow-rate measuring valve.

3. The ion-implantation machine according to claim 1 wherein said pipe further comprises a particulate filter.

4. The ion-implantation machine according to claim 1 wherein said control unit comprises means for inhibiting said vent valve when the protection valve is open.

5. The ion-implantation machine according to claim 4 wherein said control unit comprises: an electronic control module, including a control inlet, a first valve driving branch controlling said protection valve, and an auxiliary driving branch controlling said vent valve; and a switching module, having an inlet connected to said control inlet, a first outlet connected to said first valve driving branch, and a second outlet connected to said auxiliary driving branch.

6. An ion-implantation machine, comprising:
   an implantation chamber;
   a vacuum pump;
   an oxygen source;
   a first valve positioned between the vacuum pump and the implantation chamber;
   a second valve positioned between the oxygen source and the implantation chamber; and
   a controller coupled to the first and second valves and structured to alternately open the first valve to create a vacuum in the implantation chamber during a dopant implant phase and open the second valve to provide oxygen to the implantation chamber during a decontamination phase, wherein said controller comprises:
   an electronic control module that includes a control line, a first valve driving branch controlling said first valve, and second driving branch controlling said second valve; and
   a switching module having an input connected to said control line, a first output connected to control said first valve driving branch, and a second output connected to control said second driving branch.

7. The ion-implantation machine according to claim 6 wherein oxygen source includes an input port connected to environmental air.

8. The ion-implantation machine according to claim 6 wherein said controller comprises means for inhibiting said first valve when the second valve is open.

9. An ion-implantation machine, comprising:
   means for implanting heavy ionic species in a wafer positioned in an implantation chamber kept in vacuum conditions; and
   decontaminating means for decontaminating said implantation chamber by supplying a fluid containing oxygen into the implantation chamber, wherein said implantation chamber includes a vent inlet and said decontaminating means include a vent pipe having a flow-rate metering valve connected to said vent inlet, wherein said vent pipe further comprises a particulate filter.

10. The ion-implantation machine according to claim 9, further comprising:
    a cryogenic pump connected to the implantation chamber; and
    control means for enabling the cryogenic pump to vacuum the implantation chamber while the heavy ionic species are implanted in the wafer and for disconnection the cryogenic pump from said implantation chamber when the implantation chamber is decontaminated.

11. The ion-implantation machine according to claim 9 wherein said decontaminating means comprise means for supplying environmental air to said implantation chamber.

12. The ion-implantation machine according to claim 9 wherein said heavy ionic species are first ionic species and said decontaminating means include means for decontaminating the implantation chamber during crossover between said heavy ionic species and second ionic species lighter than said heavy ionic species.

* * * * *